(12) United States Patent
Goheen

(10) Patent No.: US 6,326,541 B1
(45) Date of Patent: Dec. 4, 2001

(54) SOLAR/THERMAL RADIATION CELL DEVICE

(76) Inventor: Byron R. Goheen, P.O. Box 425, Sun Valley, ID (US) 83353

(*) Notice: Subject to any disclaimer, the term of this patent is extended or adjusted under 35 U.S.C. 154(b) by 0 days.

(21) Appl. No.: 09/473,133

(22) Filed: Dec. 28, 1999

(51) Int. Cl.$^7$ .................... H01L 31/058; H01L 35/32
(52) U.S. Cl. .............. 136/253; 136/205; 136/248; 136/206; 313/14; 313/605; 313/606; 313/45; 313/310
(58) Field of Search .................... 136/253, 205, 136/248, 206; 313/14, 605, 606, 45, 310

(56) References Cited

U.S. PATENT DOCUMENTS

| | | |
|---|---|---|
| 1,221,270 | 4/1917 | Bard . |
| 3,516,871 | 6/1970 | Lewis . |
| 3,879,228 * | 4/1975 | Theodorou et al. ............. 136/206 |
| 5,028,835 | 7/1991 | Fitzpatrick . |
| 5,089,054 | 2/1992 | Sievers . |
| 5,487,790 | 1/1996 | Yasuda . |
| 5,554,819 | 9/1996 | Baghai-Kermani . |
| 5,608,181 | 3/1997 | Yasuda . |
| 5,660,644 | 8/1997 | Clemens . |
| 6,084,173 * | 7/2000 | DiMatteo ..................... 136/201 |
| 6,232,546 * | 5/2001 | DiMatteo et al. ............... 136/253 |

FOREIGN PATENT DOCUMENTS

| | | |
|---|---|---|
| 56-60324 | 5/1981 | (JP) . |
| 56-60325 | 5/1981 | (JP) . |
| 56-157825 | 12/1981 | (JP) . |
| 56-162020 | 12/1981 | (JP) . |
| 724-943 | 3/1980 | (SU) . |

OTHER PUBLICATIONS

M.G. Say, ed., Electrical Engineer's Reference Book, George Newnes Limited, Great Britain, 1964, pp. 1–42.*

The Electrical Engineer's Reference Book, M. G. Say, George Newnes Limited, Tower House, Southhampton Street, London, W.C.2, 11th Edn., 1964, pp. 1–42.

* cited by examiner

Primary Examiner—Alan Diamond
(74) Attorney, Agent, or Firm—Richard C. Litman

(57) ABSTRACT

A solar/thermal radiation cell device comprising at least two parallel metal or semiconductor plates of equal or unequal dimensions separated by an air or an insulated gap and based on an insulator slab for producing electricity from solar energy. Multiple cells are arranged in a stack and connected in series and/or parallel to cascade the electrical energy obtained.

20 Claims, 1 Drawing Sheet

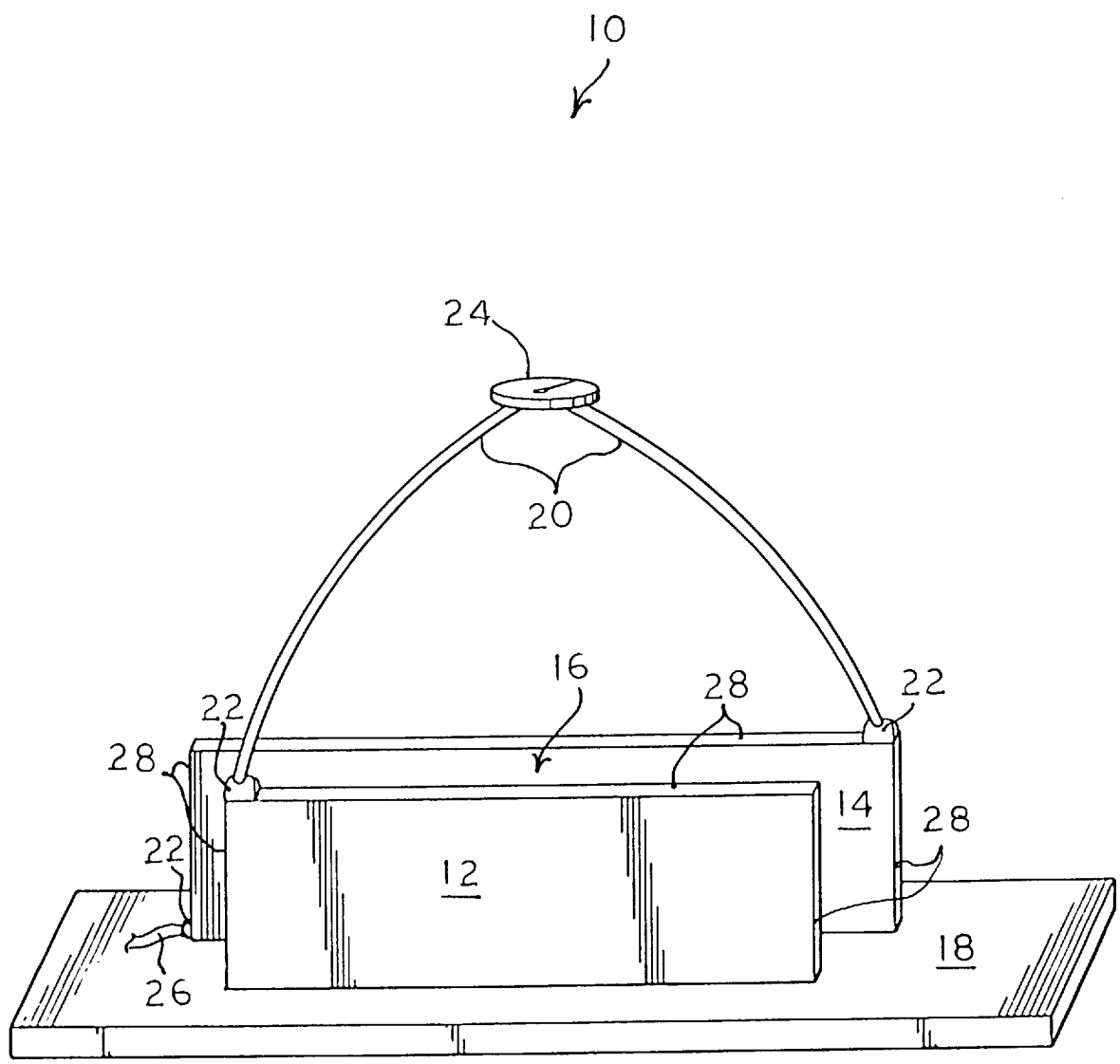

SOLAR/THERMAL RADIATION CELL DEVICE

BACKGROUND OF THE INVENTION

1. Field of the Invention

The present invention relates generally to production of electricity by thermionic and solar radiation means. More specifically, the cell device comprises at least two metal plates having different areas separated by a predetermined uniform air gap and mounted on an insulator plate to produce electricity from solar energy.

2. Description of the Related Art

The relevant art of interest describes various solar cells, but none discloses the present invention. There is a need for a simplified but economical solar cell device for production of electricity for people living in sunny and isolated regions. The relevant art will be discussed in the order of perceived relevance to the present invention.

The Electrical Engineer's Reference Book, M. G. Says Ed., George Newnes Limited, London, Great Britain, 1964, page 1–42 describes thermoelectric devices, wherein FIG. 6 (f) describes a thermionic generator or diode using heat to cause electron flow from a cathode layer to an anode layer joined by presumably insulating ends with a gap under a load. The work function of the anode must be less than the cathode. There is no suggestion for unequal areas for the cathode and anode layers. The FIG. 6 (f) device is distinguishable for its operation as a heat engine. U.S. Pat. No. 5,028,835 issued on Jul. 2, 1991, to Gary O. Fitzpatrick describes a thermionic energy converter device for interplanetary space use which establishes a gap between an emitter and a collector in the presence of a high vacuum and a cesium gas atmosphere which requires an enclosure. The seven embodiments vary from an enclosure comprising an emitter wall, assumed to be a high-melting metal, and a parallel wall or buss assumed to be a metal. The collector can be copper, other metals and oxides of molybdenum or niobium plated on a sapphire, diamond or glass support. A series of opaque insulator plates are disposed between the collector support on a metal post and the buss wall. Other configurations within the device include the exclusion of opaque insulator plates (FIG. 2), insulator plates between a series of collectors on supports (FIG. 3), an emitter inside the enclosure connected by a post to the external collector support serving as an enclosure wall (FIG. 4), a device with cooling fins attached to collectors on posts (FIG. 5), and an annular configuration (FIG. 6). The device is distinguishable for its requirement for a vacuum and a cesium gas atmosphere for operation.

Japan Patent Application No. 56-60324 published on May 25, 1981, and No. 56-60325 published on Jun. 25, 1981, for Keigorou Shigayama describes an infrared ray detector device wherein a plurality of two detecting elements of the same material having a pyroelectric effect with opposite polarities are stacked between reflective plates and confined in a circular enclosure. The device is distinguishable for its different structure and limited use for detecting only infrared rays.

U.S. Pat. No. 5,660,644 issued on Aug. 26, 1997, to Donald D. Clemens describes a lightweight photovoltaic concentrator device for use in space for satellites and spacecraft. The generation of electricity is obtained by using gallium arsenide solar cells connected to thin fin plates serving as heat sinks and receiving solar energy reflected from inflated and silvered Kapton surfaces. The device is distinguishable for its solar cell use.

U.S. Pat. No. 1,221,270 issued on Apr. 3, 1917, to Jacob W. Bard describes a thermocouple device for a mercury motor meter comprising the soldering of two dissimilar metal pieces, e.g., copper and an alloy, at a reduced area region which is wound in a high resistance coil. The C-shaped metal pieces form a rectangular open box shape with their notched ears extending above the box configuration. The thermocouple is distinguishable for its function as creating a difference in potential to measure temperature.

U.S. Pat. No. 3,516,871 issued on Jun. 23, 1970, to Arlin C. Lewis describes a method of producing an electric current utilizing a copper oxide thermoelectric generator by heating to elevated temperatures. The composition comprises a copper oxide or tungsten oxide core melted into a copper or tungsten casing and sealing the top region with a melt of copper or tungsten. One conductor lead is embedded in the core and the other conductor lead is soldered to the casing. The device is distinguishable for its solid structure.

U.S. Pat. No. 5,089,054 issued on Feb. 18, 1992, to Robert K. Sievers describes a flat plate alkali metal thermoelectric converter module device comprising stacked cells connected in parallel by leads (not shown). Molten sodium in a chamber is fed to porous wicks of a module and utilized to create ionization of sodium in a layer of beta-alumina which frees electrons to be conducted by a bed plate to tungsten springs and electrodes of an adjacent cell where the electrons combine with emerging sodium ions. The reformed sodium atoms vaporize and flow into a condenser and recycled to the converter device. The device is distinguishable for its limitation to use of molten alkali metal.

U.S. Pat. No. 5,554,819 issued on Sep. 10, 1969, to A. Baghai-Kermani describes a method and apparatus for the thermoelectric generation of electricity by either exposing to solar energy or passing air. A row of metallic or semiconductive thermocouples are embedded in a ceramic insulator layer and connected in series to a row of similar thermocouples embedded in another ceramic insulator layer separated by an intermediate layer of epoxy resin. A bottom layer of a moisture absorbent material such as a porous ceramic or plastic absorbs water from a passing air current to develop thermoelectric generation of electricity.

The apparatus is distinguishable for its solid structure and the requirement for a porous bottom layer.

U.S. Pat. No. 5,487,790 issued on Jan. 30, 1996, and U.S. Pat. No. 5,608,181 (divisional) issued on Mar. 4, 1997, to Shigeyuki Yasuda describe an electric power generating device comprising a positive electrode layer on a 40 wt. % graphite in polyethylene glycol saturated polyester resin fabric, and a Kraft paper separator layer which covers a negative electrode layer of a composition of 30 wt. % lithium chloride in polyethylene glycol saturated polyester resin fabric. The device is distinguishable for its unique composition and lack of an air gap.

Japan Patent Application No. 56-157825 published on Dec. 5, 1981, for Yasuo Kishi describes a pyroelectric type infrared ray detecting device. A LiTaO$^3$ pellet is deposited on a NiCr electrode layer deposited on a heat insulated base. Two leads are connected to surface electrodes on top of the device. The device is distinguishable for its solid structure.

Japan Patent Application No. 56-162020 published on Dec. 12, 1981, for Masao Umetsu describes a thermopile serving as infrared radiation detector device. An insulator base has two separated vacuum-deposited thermocouple layers on an insulator base. A silicon dioxide layer is deposited on the thermocouple layers and the insulator base. A silver or aluminum layer is deposited on the silicon dioxide layer. Gold black is vacuum-deposited on the metal layer to complete the thermopile device. The device is distinguishable for its solid structure.

Soviet Union Application No. 724943 published on Mar. 30, 1980, for I. A. Benkovich describes a pyroelectric coordinate sensitive element polarization using high and low resistance electrodes to obtain a linear distribution of signals along the receiving element. A ferroelectric ceramic strip is coated with a high and low ohmic resistance layers on opposite sides. The circuit contains a resistor and a DC power source. The device is distinguishable for its solid structure.

None of the above inventions and patents, taken either singularly or in combination, is seen to describe the instant invention as claimed. Thus, a solar/thermal radiation cell device solving the aforementioned problems of minimizing cost for people in sunny and isolated regions is desired.

SUMMARY OF THE INVENTION

Accordingly, it is a principal object of the invention to provide an economical device for production of electricity.

It is another object of the invention to provide an economical device for production of electricity from solar energy.

It is a further object of the invention to provide an economical device for production of electricity from a pair of parallel copper plates having a small air gap, a size differential and based on an insulator plate.

Still another object of the invention is to provide a sandwich of the parallel plates for cascading the converted voltage obtained from solar energy.

It is an object of the invention to provide improved elements and arrangements thereof for the purposes described which is inexpensive, dependable and fully effective in accomplishing its intended purposes.

These and other objects of the present invention will become readily apparent upon further review of the following specification and drawings.

BRIEF DESCRIPTION OF THE DRAWINGS

The sole FIGURE is a perspective schematic view of a solar/thermal radiation cell according to the present invention.

DETAILED DESCRIPTION OF THE PREFERRED EMBODIMENTS

The FIGURE illustrates a solar/thermal radiation cell device 10 having a pair of metal and/or semiconductor plates 12 and 14 placed in a parallel position defining a gap 16 of a predetermined dimension and positioned vertically on a horizontal insulator plate 18. Plate 12 is in front and has a predetermined smaller area than plate 14. A conductor wire 20 is connected to both plates by a silver solder joint 22. A voltage meter 24 is placed in the wire 20 for determining the optimum position to receive solar radiation. Wire 26 conducts the current to a rechargeable DC battery (not shown).

Suitable compositions for the plates 12 and 14 can be copper, galvanized iron, and semiconductors such as p- and n-doped silicon or germanium, doped gallium arsenide, and the like. The compositions can be mixed such as rear copper plate with a front galvanized iron or a semiconductor plate.

It has been found that the best position for device 10 to receive and convert heat radiation or solar energy to direct current electricity is from above. Therefore, it is advisable to coat the exposed edges 28 of the device with a thin layer of an insulator.

The preferred spacing or gap 16 between the plates 12 and 14 has been determined to be approximately less than 1.0 mm., but the gap can be defined by the primary solar or thermal radiation wavelength and the secondary harmonic wavelengths thereof. The gap can be open or filled with a suitable insulator layer. The sizes of the plates are limited only by the bulk tolerated by the user.

The shapes of the plates 12 and 14 need not be rectangular as shown, but can be externally arcuate such as being semicircular with the longer dimension being supported by the insulator plate 18. The arrangement can be circular rather than linear, but produces less electricity. The preferred metal for both plates is copper. A thin transparent coating of the plates 12 and 14 can be added to minimize an electron cloud and the formation of blue copper sulfate. The device 10 can have a pair of plates 12, 14 made of the same metal with different surface areas. Alternatively, the plates 12, 14 can be made of dissimilar metals and have equal surface areas. The plates 12 and 14 can be cemented to the insulator plate 18 which can be ceramic and the like.

Multiple cells 10 can be arranged in a stack and connected in series and/or parallel to cascade the electrical energy obtained. The multiple cells 10 need not be physically connected by wires either in series or in parallel.

Other less efficient configurations of the plates include the placement of the plates of equal size on an insulator base having a hole and the apertured base exposed to the sun or a heat source. When an array of holes were made in the exposed plate, greater current was obtained from the apertured plate then when the non-apertured plate was exposed. When non-apertured plates with a size differential are utilized a greater efficiency resulted with the smaller plate exposed to the thermal or solar radiation.

Thus, an economical device receptive to thermionic and solar radiation for conversion to electricity has been shown.

It is to be understood that the present invention is not limited to the embodiment described above, but encompasses any and all embodiments within the scope of the following claims.

I claim:

1. An open solar/thermal radiation cell device comprising:
   a front plate having a first size and shape;
   a rear plate having a second size and shape, wherein the front and rear plates are made of the same metal and have different surface areas;
   a gap separating the front plate from the rear plate which are placed in an uncovered parallel position;
   an insulator base plate for supporting the front plate and the rear plate in a vertical position; and
   a conductor wire connecting the front plate to the rear plate;
   whereby solar or thermal radiation is converted to electrical energy by exposure of the gap to the sun or heat.

2. The open solar/thermal radiation cell device according to claim 1, wherein the shape of the front and rear plates is selected from rectangular or semicircular with the side having the longer dimension supported by the insulator base plate.

3. The open solar/thermal radiation cell device according to claim 1, wherein the front and rear plates are separated by the gap determined by the primary solar/thermal radiation wavelength and the secondary harmonic wavelengths thereof.

4. The open solar/thermal radiation cell device according to claim 1, wherein the front and rear plates are copper.

5. The open solar/thermal radiation cell device according to claim 1, wherein the front and rear plates are separated by a solid insulating layer.

6. The open solar/thermal radiation cell device according to claim 1, wherein the front and rear plates are coated with a thin transparent insulator layer for minimizing an electron cloud.

7. The open solar/thermal radiation cell device according to claim 1, wherein multiple cells are arranged in a stack and connected in series and/or parallel to cascade the electrical energy obtained.

8. An open solar/thermal radiation cell device comprising:
   a front plate having a first size and shape;
   a rear plate having a second size and shape, wherein the front and rear plates are made of dissimilar materials and have equal surface areas, wherein the materials for the plates are selected from the group consisting of copper, galvanized iron and semiconductor;
   a gap separating the front plate from the rear plate which are placed in an uncovered parallel position;
   an insulator base plate for supporting the front plate and the rear plate in a vertical position; and
   a conductor wire connecting the front plate to the rear plate;
   whereby solar or thermal radiation is converted to electrical energy by exposure of the gap to the sun or heat.

9. The open solar/thermal radiation cell device according to claim 8, wherein the shape of the front and rear plates is selected from rectangular or semicircular with the side having the longer dimension supported by the insulator base plate.

10. The open solar/thermal radiation cell device according to claim 8, wherein the front and rear plates are separated by the gap determined by the primary solar/thermal radiation wavelength and the secondary harmonic wavelengths thereof.

11. The open solar/thermal radiation cell device according to claim 8, wherein the front plate is made of copper and the rear plate is made of galvanized iron.

12. The open solar/thermal radiation cell device according to claim 8, wherein the front and rear plates are separated by a solid insulating layer.

13. The open solar/thermal radiation cell device according to claim 8, wherein the front and rear plates are coated with a thin transparent insulator layer for minimizing an electron cloud.

14. The open solar/thermal radiation cell device according to claim 8, wherein multiple cells are arranged in a stack and connected in series and/or parallel to cascade the electrical energy obtained.

15. An open solar/thermal radiation cell device comprising:
   a front plate having a first size and shape;
   a rear plate having a second size and shape and have equal surface areas, wherein the front plate is copper and the rear plate is a semiconductor material;
   a gap separating the front plate from the rear plate which are placed in a parallel uncovered position;
   an insulator base plate for supporting the uncovered front plate and the rear plate in a vertical position; and
   a conductor wire connecting the front plate to the rear plate;
   whereby solar or thermal radiation is converted to electrical energy by exposure of the gap to the sun or heat.

16. The open solar/thermal radiation cell device according to claim 15, wherein the shape of the front and rear plates is selected from rectangular or semicircular with the side having the longer dimension supported by the insulator base plate.

17. The open solar/thermal radiation cell device according to claim 15, wherein the front and rear plates are separated by the gap determined by the primary solar/thermal radiation wavelength and the secondary harmonic wavelengths thereof.

18. The open solar/thermal radiation cell device according to claim 15, wherein the rear plate is made of semiconductor material selected from the group consisting of doped silicon, doped germanium, and doped gallium arsenide.

19. The open solar/thermal radiation cell device according to claim 15, wherein the front and rear plates are coated with a thin transparent insulator layer for minimizing an electron cloud.

20. The open solar/thermal radiation cell device according to claim 15, wherein multiple cells are arranged in a stack and connected in series and/or parallel to cascade the electrical energy obtained.

* * * * *